US009397065B1

(12) United States Patent
Nguyen et al.

(10) Patent No.: US 9,397,065 B1
(45) Date of Patent: Jul. 19, 2016

(54) FIXTURE DESIGN FOR PRE-ATTACHMENT PACKAGE ON PACKAGE COMPONENT ASSEMBLY

(71) Applicant: Flextronics AP, LLC, Broomfield, CO (US)

(72) Inventors: Jennifer Nguyen, Milpitas, CA (US); David Geiger, Dublin, CA (US); Ranilo Aranda, Kawit (PH); Jonas Sjoberg, Singapore (SI); Anwar Mohammed, San Jose, CA (US); Murad Kurwa, San Jose, CA (US)

(73) Assignee: Flextronics AP, LLC, Broomfield, CO (US)

( * ) Notice: Subject to any disclaimer, the term of this patent is extended or adjusted under 35 U.S.C. 154(b) by 0 days.

(21) Appl. No.: 14/468,216

(22) Filed: Aug. 25, 2014

Related U.S. Application Data

(60) Provisional application No. 61/870,627, filed on Aug. 27, 2013.

(51) Int. Cl.
*H01L 23/544* (2006.01)
*H01L 23/00* (2006.01)
*H01L 25/00* (2006.01)
*H01L 23/538* (2006.01)

(52) U.S. Cl.
CPC ............ *H01L 24/65* (2013.01); *H01L 23/5386* (2013.01); *H01L 25/00* (2013.01); *H01L 2924/38* (2013.01)

(58) Field of Classification Search
CPC ..... H01L 23/5386; H01L 24/65; H01L 24/68; H01L 25/00; H01L 21/682; H01L 23/544

USPC ............ 257/797, E23.179, E21.505; 438/975
See application file for complete search history.

(56) References Cited

U.S. PATENT DOCUMENTS

| 4,069,497 A | 1/1978 | Steidlitz |
| 4,371,912 A | 2/1983 | Guzik |
| 4,600,611 A * | 7/1986 | Clark ............................. 428/13 |
| 4,712,160 A | 12/1987 | Sato et al. |
| 4,795,518 A | 1/1989 | Meinel et al. |
| 4,881,885 A * | 11/1989 | Kovac ..................... H01L 21/56 257/E21.502 |

(Continued)

OTHER PUBLICATIONS

Notice of Allowance dated Jun. 4, 2015. U.S. Appl. No. 14/565,295, filed Dec. 9, 2014, Applicant; Omar Garcia Lopez, 14 pages.

(Continued)

*Primary Examiner* — Jasmine Clark
(74) *Attorney, Agent, or Firm* — Haverstock & Owens LLP

(57) ABSTRACT

Embodiments of the present invention relate to a fixture design for pre-attachment package on package component assembly. The fixture design includes a plurality of pockets arranged in a N×M array. The plurality of pockets is sized to receive bottom packages. The fixture design includes global fiducials that are used to locate positions of the pockets on the fixture, and sets of local fiducials, with each set being specific to one of the pockets and used to refine the position of the location of a corresponding pocket. Each of the pockets can include one or more ear cuts for easy component placement and component removal. The fixture design can include a vacuum port for coupling with a vacuum source for drawing a vacuum to hold the bottom packages down. The fixture design can also include a cover that is used with the fixture to keep the components from being disturbed.

19 Claims, 3 Drawing Sheets

(56) References Cited

U.S. PATENT DOCUMENTS

| | | |
|---|---|---|
| 4,899,256 A | 2/1990 | Sway-Tin |
| 5,101,322 A | 3/1992 | Ghaem et al. |
| 5,201,451 A | 4/1993 | Desai |
| 5,235,491 A | 8/1993 | Weiss |
| 5,272,599 A | 12/1993 | Koenen |
| 5,282,312 A * | 2/1994 | DiStefano et al. ............ 29/830 |
| 5,295,044 A | 3/1994 | Araki et al. |
| 5,365,403 A | 11/1994 | Vinciarelli et al. |
| 5,536,677 A | 7/1996 | Hutbacher |
| 5,552,611 A * | 9/1996 | Enichen .................. 250/491.1 |
| 5,838,554 A | 11/1998 | Lanni |
| 5,872,051 A | 2/1999 | Fallon et al. |
| 5,873,512 A | 2/1999 | Bielick et al. |
| 5,920,458 A | 7/1999 | Azar |
| 5,933,324 A | 8/1999 | Barrett |
| 6,081,037 A * | 6/2000 | Lee .................. H01L 23/13 257/706 |
| 6,189,771 B1 | 2/2001 | Maeda et al. |
| 6,198,367 B1 | 3/2001 | Matsunaga et al. |
| 6,243,269 B1 | 6/2001 | Dibene, II et al. |
| 6,245,595 B1 | 6/2001 | Nguyen |
| 6,272,015 B1 | 8/2001 | Mangtani |
| 6,282,092 B1 | 8/2001 | Okamoto et al. |
| 6,296,169 B1 | 10/2001 | Ong |
| 6,311,139 B1 | 10/2001 | Kuroda et al. |
| 6,369,328 B1 | 4/2002 | Munakata |
| 6,400,573 B1 | 6/2002 | Mowatt et al. |
| 6,425,518 B1 | 7/2002 | Gruber |
| 6,549,409 B1 | 4/2003 | Saxelby et al. |
| 6,627,987 B1 * | 9/2003 | Glenn et al. ................ 257/704 |
| 6,627,993 B1 | 9/2003 | Shen |
| 6,749,690 B2 * | 6/2004 | Clark .................. H01L 21/682 148/DIG. 102 |
| 6,775,162 B2 | 8/2004 | Mihai et al. |
| 6,795,315 B1 | 9/2004 | Wu et al. |
| 7,208,833 B2 | 4/2007 | Nobori et al. |
| 7,676,775 B2 | 3/2010 | Chen et al. |
| 8,534,136 B2 | 9/2013 | Xie et al. |
| 8,615,724 B2 | 12/2013 | Durkan |
| 8,707,221 B2 | 4/2014 | Durkan |
| 2001/0003427 A1 | 6/2001 | Ferguson et al. |
| 2001/0018263 A1 | 8/2001 | Ochiai et al. |
| 2001/0045297 A1 | 11/2001 | Miller et al. |
| 2002/0008963 A1 | 1/2002 | DiBene, II et al. |
| 2002/0092160 A1 | 7/2002 | McCullough |
| 2004/0101624 A1 | 5/2004 | Bayes |
| 2004/0122606 A1 | 6/2004 | Cohen et al. |
| 2004/0144527 A1 | 7/2004 | Yang et al. |
| 2005/0167899 A1 | 8/2005 | Aldridge et al. |
| 2005/0246590 A1 | 11/2005 | Lancaster |
| 2006/0196642 A1 | 9/2006 | Gharib |
| 2007/0198548 A1 | 8/2007 | Lee |
| 2007/0273011 A1 | 11/2007 | Singleton et al. |
| 2008/0217768 A1 | 9/2008 | Miranda et al. |
| 2008/0224026 A1 | 9/2008 | Pasternak |
| 2008/0301597 A1 | 12/2008 | Chen et al. |
| 2009/0014501 A1 | 1/2009 | Nishi et al. |
| 2009/0102071 A1 * | 4/2009 | Kindo .................. H01L 23/3128 257/797 |
| 2009/0265155 A1 | 10/2009 | Yokogawa |
| 2011/0115057 A1 * | 5/2011 | Harn .................. H01L 2924/0002 257/797 |
| 2001/0225816 | 9/2011 | Chou |
| 2011/0290540 A1 | 12/2011 | Jung |
| 2011/0307752 A1 | 12/2011 | Fuji et al. |
| 2012/0273559 A1 | 11/2012 | Patterson |
| 2013/0256580 A1 | 10/2013 | Doi et al. |
| 2014/0248722 A1 | 9/2014 | Liu |

OTHER PUBLICATIONS

Notice of Allowance dated Mar. 31, 2015. U.S. Appl. No. 13/753,422, filed Jan. 29, 2013, Applicant; Henrik Jacobsson, 7 pages.

Non-Final Office Action mailed on Dec. 8, 2015, U.S. Appl. No. 14/331,035, filed Jul. 14, 2014, Jennifer Nguyen et al., 12 pages.

* cited by examiner

Exemplary Fiducial Marks

FIXTURE DESIGN FOR PRE-ATTACHMENT PACKAGE ON PACKAGE COMPONENT ASSEMBLY

RELATED APPLICATIONS

This application claims benefit of priority under 35 U.S.C. section 119(e) of the U.S. Provisional Patent Application Ser. No. 61/870,627, filed Aug. 27, 2013, entitled "Interconnect Methods," which is hereby incorporated by reference in its entirety.

FIELD OF INVENTION

The present invention relates to package on package (PoP) assemblies. More particularly, the present invention relates to a fixture design for pre-attachment package on package component assembly.

BACKGROUND OF THE INVENTION

Package on package (PoP) is an integrated circuit packaging method that combines vertically discrete packages. Two or more packages are stacked on top of each other, with a standard interface to route signals between them. PoP assembly has become useful for manufacturing smartphone, tablet and camera to save on board space.

BRIEF SUMMARY OF THE INVENTION

Embodiments of the present invention relate to a fixture design for pre-attachment package on package component assembly. The fixture design includes a plurality of pockets arranged in a N×M array. The plurality of pockets is sized to receive bottom packages. The fixture design includes global fiducials that are used to locate positions of the pockets on the fixture, and sets of local fiducials, with each set being specific to one of the pockets and used to refine the position of the location of a corresponding pocket. Each of the pockets can include one or more ear cuts for easy component placement and component removal. The fixture design can include a vacuum port for coupling with a vacuum source for drawing a vacuum to hold the bottom packages down. The fixture design can also include a cover that is used with the fixture to keep the components from being disturbed.

In one aspect, a surface mount technology (SMT) fixture is provided. The SMT fixture includes a plurality of pockets sized to receive components, global fiducials located along a perimeter of the SMT fixture, and sets of local fiducials, wherein each of the sets specific to one of the pockets.

In some embodiments, the global fiducials are located as far apart as possible on the SMT fixture. In some embodiments, the sets of local fiducials are located closer to the pockets than the global fiducials.

In some embodiments, the global fiducials are used to locate positions of the pockets and each set of the local fiducials is used to refine the location of the position of a corresponding pocket.

In some embodiments, the local fiducials are holes. Alternatively, the local fiducials are markings.

In some embodiments, each of the pockets includes at least one ear cut. In some embodiments, the at least one ear cut is a void that is located adjacently to a respective pocket. In some embodiments, the at least one ear cut is sized and adapted for receiving a tool that is used for placing a corresponding component in the respective pocket and for removing the corresponding component in the respective pocket. The size of the at least one ear cut is smaller than the size of the respective pocket.

In some embodiments, the SMT fixture further includes a vacuum port.

In another aspect, a system is provided. The system includes a surface mount technology (SMT) fixture. The SMT fixture includes a plurality of pockets are arrange in rows and columns. In some embodiments, the pockets are exactly sized to receive components.

The SMT fixture also includes global fiducials located along a perimeter of the SMT fixture, and sets of local fiducials, wherein each of the sets specific to one of the pockets. In some embodiments, the global fiducials surrounds the sets of local fiducials. In some embodiments, the local fiducials are used to make incremental adjustments for refining aligning and placement accuracy. In some embodiments, each local fiducial in a corresponding set is located at a distance from and surrounds a respective pocket. In some embodiments, each of the sets includes at least two local fiducials that are substantially diagonally opposite a respective pocket.

In some embodiments, the SMT fixture further includes a plurality of ear cuts adjacent to each of the pockets. In some embodiments, the SMT fixture further includes a vacuum port. The vacuum port couples with a vacuum source for drawing a vacuum to hold components in the SMT fixture.

The system also includes a cover for coupling with the SMT.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

In the following description, numerous details are set forth for purposes of explanation. However, one of ordinary skill in the art will realize that the invention can be practiced without the use of these specific details. Thus, the present invention is not intended to be limited to the embodiments shown but is to be accorded the widest scope consistent with the principles and features described herein.

Figure 1:
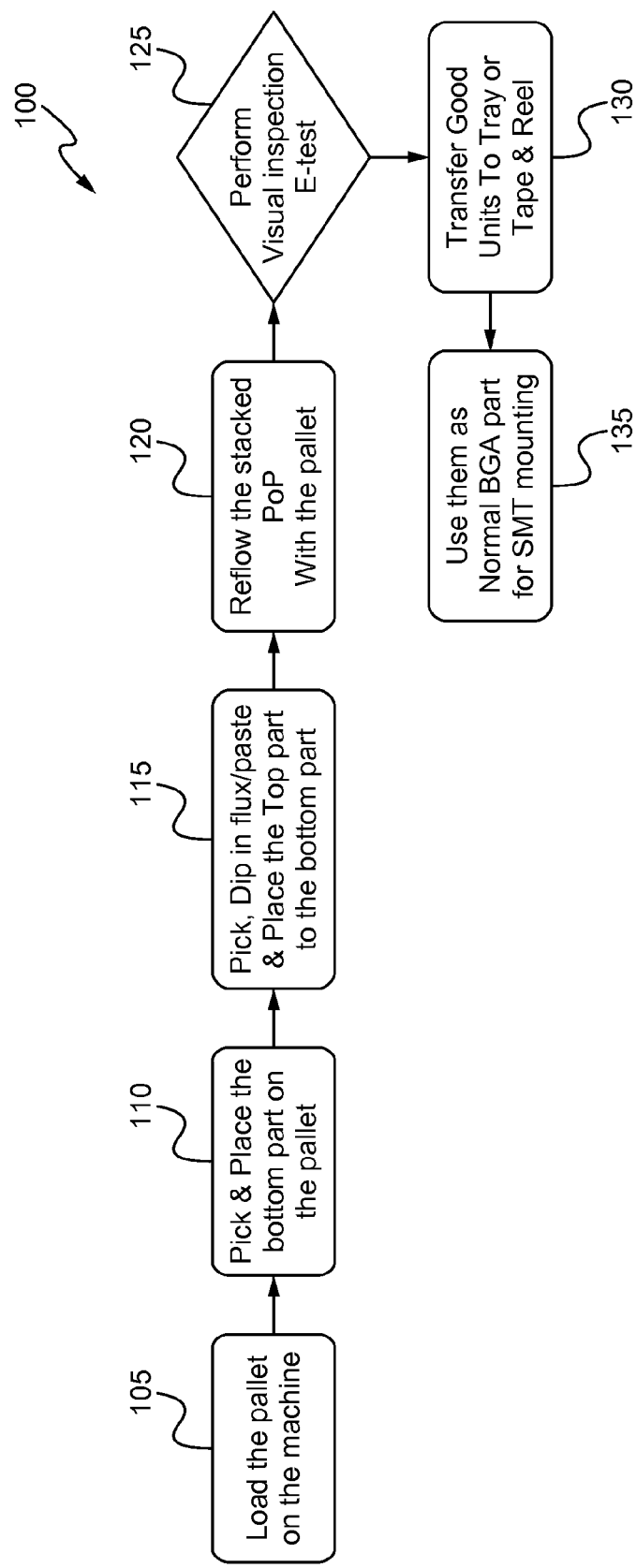
FIG. 1 illustrates a flow of a pre-stacked package on package (PoP) process in accordance with some embodiments of the present invention.

FIG. 1 illustrates a flow of a pre-stacked package on package (PoP) process 100 in accordance with some embodiments of the present invention. At a step 105, a pallet is loaded on a machine. The pallet is typically a surface mount technology (SMT) fixture. At a step 110, bottom PoP components are individually picked and placed on the pallet. At a step 115, top PoP component are individually picked up and dipped in tacky flux or solder paste before being placed on one of the bottom PoP components. At a step 120, the stacked PoP components on the pallet are reflowed such as in a reflow oven. At a step 125, a visual inspection is performed to identify bad units from good units. At a step 130, the good units are transferred to a tray or a tape and reel for further processing. For example, at a step 135, the good units are mounted on system boards.

Figure 2:
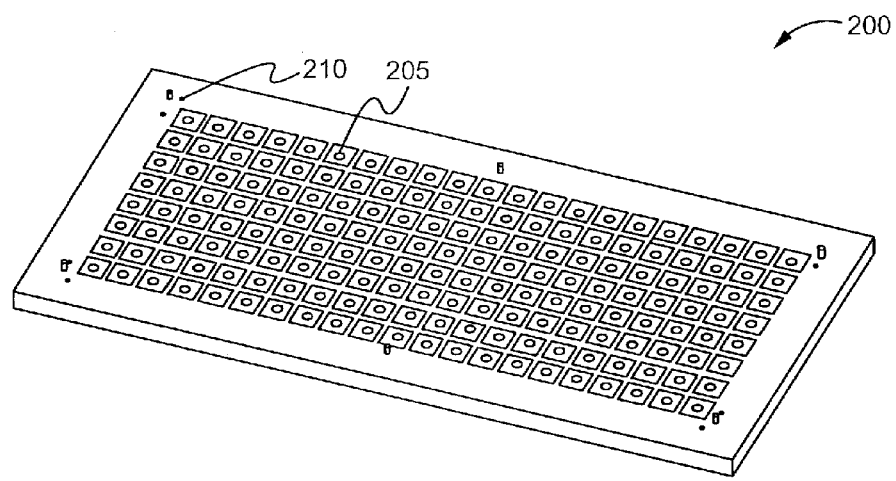
FIG. 2 illustrates a SMT fixture in the prior art.

FIG. 2 illustrates a SMT fixture 200 in the prior art. The SMT fixture 200 includes cavities 205 for receiving the bottom PoP components. The SMT fixture 200 also includes fiducials 210 that are globally shared to locate the positions of all the cavities 205. The SMT fixture 200 can be used in the pre-stacked PoP process 100. However, the SMT fixture 200 (and likewise with other existing SMT fixtures) have many issues relating to component transferring, placement, alignment, and missing components during reflow. The success of a pre-stacked PoP component assembly heavily depends on the design of the SMT fixture used in the pre-stacked PoP process 100.

Embodiments of the present invention relate to a fixture design for pre-attachment package on package component assembly. The fixture design includes a plurality of pockets arranged in a N×M array. The plurality of pockets is sized to receive bottom packages. The fixture design includes global fiducials that are used to locate positions of the pockets on the fixture, and sets of local fiducials, with each set being specific to one of the pockets and used to refine the position of the location of a corresponding pocket. Each of the pockets can include one or more ear cuts for easy component placement and component removal. The fixture design can include a vacuum port for coupling with a vacuum source for drawing a vacuum to hold the bottom packages down. The fixture design can also include a cover that is used with the fixture to keep the components from being disturbed.

Figure 3A:
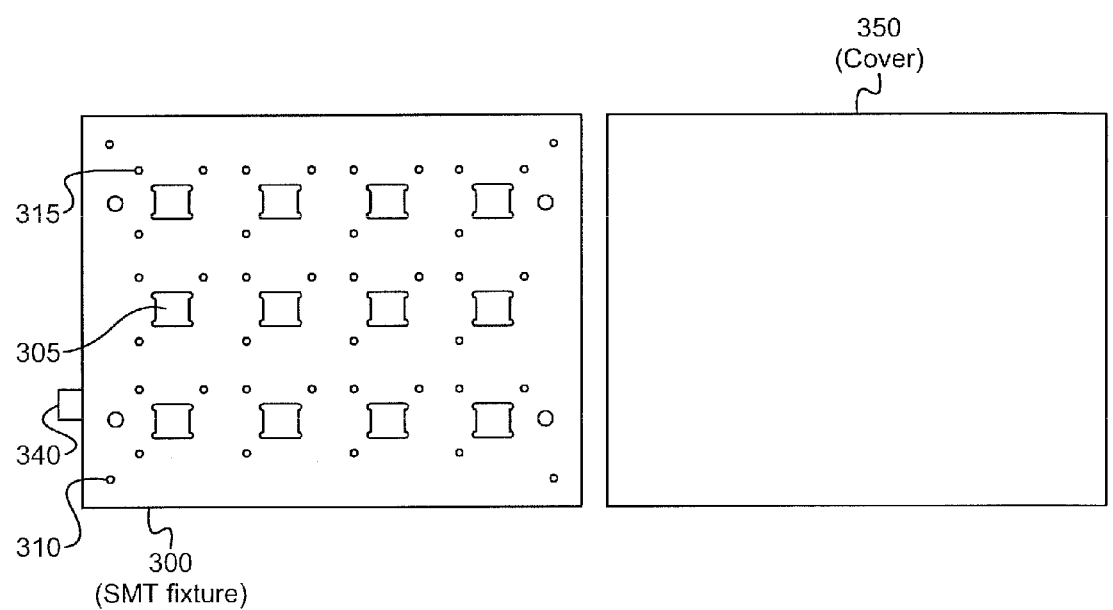
FIG. 3A illustrates an exemplary SMT fixture in accordance with some embodiments of the present invention.

FIG. 3A illustrates an exemplary SMT fixture 300 in accordance with some embodiments of the present invention. The SMT fixture 300 has a total of N×M pockets 305. In some embodiments, the pockets 305 are arranged in N columns and M rows. The pockets 305 are sized to receive bottom components. The bottom components are typically of the same type. However, the bottom components can be of different types. Exemplary components are leaded components, leadless components or a ball grid array (BGA) components.

The SMT fixture 300 also includes a fixture design that addresses the issues of prior art SMT fixtures, such as the SMT fixture 200. As it will become evident, the fixture design allows for a successful pre-attachment PoP component assembly with a high yield.

The fixture design includes global fiducials 310 and sets of local fiducials 315. The global fiducials 310 are located along a perimeter of the SMT fixture 300. As shown in FIG. 3A, the SMT fixture 300 includes four global fiducials 310, with each global fiducial 310 located at a corner of the SMT fixture 300. The global fiducials 310 are used to locate positions of the pockets 305 on the SMT fixture 300.

In contrast to the global fiducials 310, each set of local fiducials 315 is used to refine the location of the position of a corresponding pocket 305. In some embodiments, the local fiducials 315 are used to make incremental adjustments or to correct for translational movement. In some embodiments, the global fiducials 310 are located as far apart as possible on the SMT fixture 300, while the local fiducials 315 are located closer to the pockets 305. The global fiducials 310 surround the local fiducials 315.

Typically, there are N×M sets of local fiducials 315, with each set being specific to one of the pockets 305. Each local fiducial 315 in a set is located at a distance from and surrounds a corresponding pocket 305. As shown in FIG. 3A, each set includes three fiducials 315 located at three corners of a corresponding pocket 305. Two of the local fiducials 315 in the set are located at opposite corners of the corresponding pocket 305 (diagonally opposite). More or less local fiducials can be included in each set. The sets of local fiducials 315 aid in component alignment and placement accuracy of, for example, a bottom component in a pocket, or an $(i+1)^{th}$ component on top of the $i^{th}$ component during the pre-stacked PoP process 100.

Figure 4:
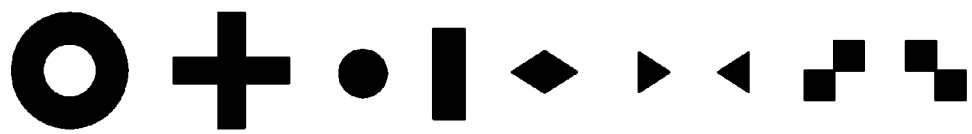
FIG. 4 illustrates exemplary markings in accordance with some embodiments of the present invention.

The local fiducials 315 can be physical holes in the SMT fixture 300 or can be another type of marking. In some embodiments, pins can be dropped in the holes for mechanical alignments. Alternatively, an optical scan is used to determine where the markings are. FIG. 4 illustrates exemplary markings in accordance with some embodiments of the present invention. Regardless of the type the local fiducials 315 are on the SMT fixture 300, the local fiducials 315 provide a refinement in locating the pockets 305 of the SMT fixture 300, thereby providing alignment and placement accuracy of components.

Without the local fiducials 315, the prior art SMT fixtures, such as the SMT fixture 200, have tolerance built into the cavities 205. Thus, the cavities 205 are typically sized larger than their received components such that the bottom components can still be placed within the cavities 205 without precisely locating the positions of the cavities 205. However, this can result in faulty stacking of components on top of the bottom components.

Figure 3B:
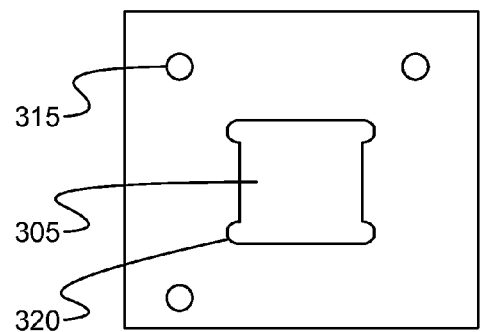
FIG. 3B illustrates an exemplary ear cut in accordance with some embodiments of the present invention.
Figure 3C:
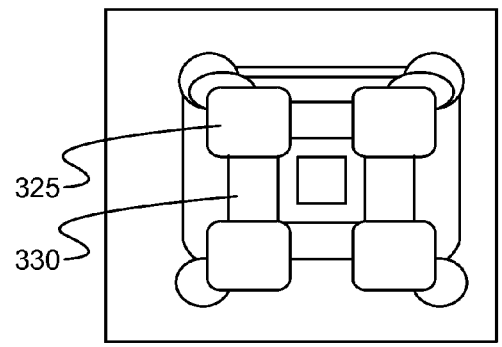
FIG. 3C illustrates tools in ear cuts of the pocket of FIG. 3B in accordance with some embodiments of the present invention.

In some embodiments, each of the pockets 305 includes at least one ear cut 320 for easy component placement and component removal, as illustrated in FIG. 3B. An ear cut 320 is a void that is located adjacently to pocket 305. The void is sized and adapted for receiving a tool that can be used for placing a component in and for removing a component from a corresponding pocket 305. FIG. 3B illustrates one ear cut 320 at each of the corners of the pocket 305, in the shape of an "I". More or less voids are contemplated. In some embodiments, the number of voids 320 associated with each pocket 305 can vary pocket to pocket. The voids are shown as semi-circular, although other shapes are contemplated. FIG. 3C illustrates tools 325 in the voids 320 of FIG. 3B for the placement or removal of a component 330 at a pocket.

It should be noted that the pocket design illustrated in FIG. 3B is exemplary. Other pocket designs are possible. For example, the pocket can be square, rectangular or any other shape, as long as the pocket is shaped and sized to receive a component. For another example, the voids can also be square, rectangular or any other shape, as long as the voids are shaped and sized to receive a tool. The voids can be located along the middle of the sides of a pocket rather than at the corners of the pocket. The size of the void is typically smaller than the pocket size to prevent or limit movement of the component in the pocket to enable component alignment and placement accuracy.

The fixture design also includes a vacuum port 340 located on the SMT fixture 300 of FIG. 3A. In some embodiments, the SMT fixture 300 includes a body with openings at a top surface that form the pockets 305. The openings extend into a chamber that is located in the body. In some embodiments, the pockets 305 are exactly sized as the components. As such, a seal is formed when the components are in the pockets 305. When in use, the vacuum port couples with a vacuum source for drawing a vacuum in the chamber to hold components that are located in the pockets 305 to prevent movement of the components.

The fixture design also includes a cover 350 that is to be placed on or over or otherwise coupled with the SMT fixture 300 to secure the components on the SMT fixture 300 from touch or movement, such as when using the reflow oven.

One of ordinary skill in the art will realize other uses and advantages also exist. While the invention has been described with reference to numerous specific details, one of ordinary skill in the art will recognize that the invention can be embodied in other specific forms without departing from the spirit of the invention. Thus, one of ordinary skill in the art will understand that the invention is not to be limited by the foregoing illustrative details, but rather is to be defined by the appended claims.

We claim:

1. A surface mount technology (SMT) fixture comprising:
   a plurality of pockets sized to receive components, wherein each of the pockets includes at least one ear cut;
   global fiducials located along a perimeter of the SMT fixture; and
   sets of local fiducials, wherein each of the sets specific to one of the pockets.

2. The SMT fixture of claim 1, wherein the global fiducials are located as far apart as possible on the SMT fixture.

3. The SMT fixture of claim 1, wherein the sets of local fiducials are located closer to the pockets than the global fiducials.

4. The SMT fixture of claim 1, wherein the global fiducials are used to locate positions of the pockets and each set of the local fiducials is used to refine the location of the position of a corresponding pocket.

5. The SMT fixture of claim 1, wherein the local fiducials are holes.

6. The SMT fixture of claim 1, wherein the local fiducials are markings.

7. The SMT fixture of claim 1, wherein the at least one ear cut is a void that is located adjacently to a respective pocket.

8. The SMT fixture of claim 1, wherein the at least one ear cut is sized and adapted for receiving a tool that is used for placing a corresponding component in the respective pocket and for removing the corresponding component in the respective pocket.

9. The SMT fixture of claim 1, wherein the size of the at least one ear cut is smaller than the size of the respective pocket.

10. The SMT fixture of claim 1, further comprising a vacuum port.

11. A system comprising:
    a surface mount technology (SMT) fixture comprising:
       a plurality of pockets are arrange in rows and columns;
       global fiducials located along a perimeter of the SMT fixture;
       sets of local fiducials, wherein each of the sets is specific to one of the pockets; and
       a plurality of ear cuts adjacent to each of the pockets; and
    a cover for coupling with the SMT.

12. The system of claim 11, wherein the global fiducials surrounds the sets of local fiducials.

13. The system of claim 11, wherein the local fiducials are used to make incremental adjustments for refining aligning and placement accuracy.

14. The system of claim 11, wherein each local fiducial in a corresponding set is located at a distance from and surrounds a respective pocket.

15. The system of claim 11, wherein each of the sets includes at least two local fiducials that are diagonally opposite a respective pocket.

16. The system of claim 11, wherein the pockets are exactly sized to receive components.

17. The system of claim 11, wherein the SMT fixture further includes a vacuum port.

18. The system of claim 17, where the vacuum port couples with a vacuum source for drawing a vacuum to hold components in the SMT fixture.

19. A surface mount technology (SMT) fixture comprising:
    a plurality of pockets sized to receive components;
    global fiducials located along a perimeter of the SMT fixture;
    sets of local fiducials, wherein each of the sets specific to one of the pockets; and
    a vacuum port.

* * * * *